United States Patent
Shoda et al.

(10) Patent No.: US 11,364,704 B2
(45) Date of Patent: Jun. 21, 2022

(54) TRANSPARENT CONDUCTIVE GAS BARRIER LAMINATE AND DEVICE INCLUDING THE LAMINATE

(71) Applicant: TOPPAN PRINTING CO., LTD., Tokyo (JP)

(72) Inventors: Ryo Shoda, Tokyo (JP); Tomohiko Yamazaki, Tokyo (JP); Kei Tsuruzoe, Tokyo (JP); Kenji Matsumasa, Tokyo (JP); Miki Fukugami, Tokyo (JP); Kengo Okamura, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 44 days.

(21) Appl. No.: 16/563,868

(22) Filed: Sep. 7, 2019

(65) Prior Publication Data
US 2020/0009829 A1    Jan. 9, 2020

Related U.S. Application Data

(63) Continuation of application No. PCT/JP2018/012139, filed on Mar. 26, 2018.

(30) Foreign Application Priority Data

Mar. 27, 2017    (JP) .............................. JP2017-061513

(51) Int. Cl.
*B32B 7/023*    (2019.01)
*B32B 7/12*    (2006.01)

(52) U.S. Cl.
CPC ................ *B32B 7/023* (2019.01); *B32B 7/12* (2013.01); *B32B 2255/20* (2013.01);
(Continued)

(58) Field of Classification Search
CPC .................. B32B 7/12; B32B 2457/00; B32B 2307/202; B32B 2307/412
See application file for complete search history.

(56) References Cited

U.S. PATENT DOCUMENTS

| 6,590,622 | B1 * | 7/2003 | Nakanishi ........... G02F 1/13338 345/104 |
| 2006/0008665 | A1 * | 1/2006 | Kotsubo ................. B32B 27/36 428/520 |

(Continued)

FOREIGN PATENT DOCUMENTS

| JP | 2002-050469 A | 2/2002 |
| JP | 2002-093242 A | 3/2002 |

(Continued)

OTHER PUBLICATIONS

Extended European Search Report dated Feb. 14, 2020 for corresponding Application No. 18774723.3.
(Continued)

*Primary Examiner* — Alicia J Sawdon
(74) *Attorney, Agent, or Firm* — Foley & Lardner LLP (57) ABSTRACT

A transparent conductive gas barrier laminate according to the present disclosure includes a transparent gas barrier film and a transparent conductive layer in this order from outside toward inside. In the laminate, the transparent gas barrier film has a b* value of more than 0 in a L*a*b* color system, and the transparent conductive layer contains a conductive polymer and has a b* value of less than 0 in the L*a*b* color system.

13 Claims, 6 Drawing Sheets

(52) U.S. Cl.
CPC .................. *B32B 2307/202* (2013.01); *B32B 2307/412* (2013.01); *B32B 2307/7242* (2013.01); *B32B 2457/00* (2013.01)

(56) References Cited

U.S. PATENT DOCUMENTS

| | | | | |
|---|---|---|---|---|
| 2010/0015431 | A1* | 1/2010 | Matsui | B32B 33/00 428/323 |
| 2014/0170431 | A1* | 6/2014 | Kenmochi | B32B 27/285 428/521 |
| 2015/0367602 | A1* | 12/2015 | Iwaya | B32B 27/08 428/522 |

FOREIGN PATENT DOCUMENTS

| | | | | |
|---|---|---|---|---|
| JP | 2003-175566 | A | | 6/2003 |
| JP | 2004148633 | A | * | 5/2004 |
| JP | 2005-222915 | A | | 8/2005 |
| JP | 2006-095783 | A | | 4/2006 |
| JP | 2006094783 | A | * | 4/2006 ............ C12M 29/10 |
| JP | 2009-176651 | A | | 8/2009 |
| JP | 2010-064303 | A | | 3/2010 |
| JP | 2012-068760 | A | | 4/2012 |
| JP | 2012068760 | A | * | 4/2012 |
| JP | 2012-086378 | A | | 5/2012 |
| JP | 2012-208169 | A | | 10/2012 |
| JP | 2012208169 | A | * | 10/2012 |
| JP | 2013-211283 | A | | 10/2013 |
| JP | 2015-185440 | A | | 10/2015 |
| JP | 2015-203770 | A | | 11/2015 |
| WO | WO-2016/157987 | A1 | | 10/2016 |

OTHER PUBLICATIONS

International Searching Authority, "International Search Report," issued in connection with International Patent Application No. PCT/JP2018/012139, dated Jun. 12, 2018.

International Searching Authority, "Written Opinion," issued in connection with International Patent Application No. PCT/JP2018/012139, dated Jun. 12, 2018.

Office Action dated May 27, 2021 issued in a corresponding Chinese Patent Application No. 201880016780.5, (11 pages).

Notification of Reasons for Rejection issued in corresponding Japanese Patent Application No. 2019-509805 dated Feb. 8, 2022 (English translation included).

* cited by examiner

TRANSPARENT CONDUCTIVE GAS BARRIER LAMINATE AND DEVICE INCLUDING THE LAMINATE

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2018/012139, filed on Mar. 26, 2018, which is based upon and claims the benefit of priority to and Japanese Patent Application No. 2017-061513, filed on Mar. 27, 2017; the disclosures of which are all incorporated herein by reference in their entireties.

TECHNICAL FIELD

The present disclosure relates to a transparent conductive gas barrier laminate including a transparent gas barrier film and a transparent conductive layer in this order from outside toward inside, and a device including the laminate.

BACKGROUND ART

Electronic devices having a structure protected by a laminate film are under development. Such a laminate film includes a moisture-resistant layer or a gas barrier layer. For example, PTL 1 discloses a support for a conductive layer which includes a resin sheet, a moisture-resistant layer, an adhesive layer and a resin sheet in this order, and electronic paper using the support. PTL 2 discloses a transparent conductive film including a base layer, a gas barrier layer made of a predetermined material, and a transparent conductive layer, and an electronic device including the film.

CITATION LIST

[Patent Literature] PTL 1: JP 2003-175566 A; PTL 2: JP 2012-86378 A

SUMMARY OF THE INVENTION

Technical Problem

Transparent gas barrier laminates used for electronic devices are not necessarily colorless and transparent but may have a hue, although they may yet be transparent, depending on the materials of the layers or films included in the laminate, or the conditions for forming the layers or films. In particular, transparent gas barrier laminates based on the conventional art tend to have a yellowish hue as stated below.

As a material for forming conventional transparent conductive layers, indium tin oxide (ITO) has been widely used. Transparent conductive layers made of ITO are formed, for example, by sputtering on a transparent resin film. When a transparent conductive layer of ITO is formed on a transparent resin film under temperature conditions not thermally deteriorating the transparent resin film (e.g., about 150° C.), the ITO contained in the layer may be amorphous. Such amorphous ITO has low transmissivity for short-wavelength light, such as blue light. Therefore, the transparent conductive layer may appear to have a yellowish hue.

As layers serving as a gas barrier in a transparent gas barrier laminate, vapor-deposited layers made of silicon oxide have been used. According to research conducted by the inventors of the present invention, vapor-deposited layers obtained by depositing silicon oxide may also appear to have a yellowish hue, depending on the temperature conditions or the like.

Device makers or consumers in recent years tend to avoid transparent materials having a yellowish hue. To cope with this, the present disclosure aims to provide a transparent conductive gas barrier laminate in which a yellowish hue has been sufficiently reduced, and a device including the laminate.

[Improvement or Solution to Problem]

An aspect of the present disclosure relates to a transparent conductive gas barrier laminate including a transparent gas barrier film and a transparent conductive layer in this order from outside toward inside. In the transparent conductive gas barrier laminate, the transparent gas barrier film has a b* value of more than 0 in the L*a*b* color system, and the transparent conductive layer contains a conductive polymer and has a b* value of less than 0 in the L*a*b* color system. The expression "b* of more than 0 in the L*a*b* color system" refers to generally having a yellowish hue, while the expression "b* of less than 0 in the L*a*b* color system" refers to generally having a bluish hue. The term "inside" of the transparent conductive gas barrier laminate refers to a side on which a driven unit to be protected by the laminate is disposed, and the term "outside" refers to a side facing away from the inside. The term "transparent" refers to being transparent at least for visible light.

In the transparent conductive gas barrier laminate, the transparent gas barrier film having a yellowish hue is combined with the transparent conductive layer having a bluish hue. Yellow and blue are in a complementary relationship. Therefore, even though the transparent gas barrier film has a yellowish hue, the transparent conductive layer having a bluish hue exerts an overall effect of reducing the yellowish hue when the transparent conductive gas barrier laminate is observed.

An example of the transparent gas barrier film having a yellowish hue may be one that includes a transparent base film and a barrier layer which is formed on at least one surface of the transparent base film. A specific example of the barrier layer may be one which at least includes a silicon oxide-deposited layer. As mentioned above, a silicon oxide-deposited layer tends to have a yellowish hue. If the silicon oxide-deposited layer having a yellowish hue is combined with the transparent conductive layer having a bluish hue, the yellowish hue is reduced overall when the transparent conductive gas barrier laminate is observed. From the perspective of achieving high gas barrier properties, the transparent gas barrier film may include at least two pairs of films, each pair being a transparent base film and a barrier layer, with an adhesive layer interposed therebetween, and each barrier layer in this case may at least include a silicon oxide-deposited layer.

The material for forming the transparent conductive layer having a bluish hue may be a conductive polymer which contains a mixture of polyethylene dioxythiophene (PEDOT) and polystyrene sulfonic acid (PSS) (this mixture may be termed PEDOT/PSS hereinafter). Specifically, the transparent conductive gas barrier laminate according to the present disclosure includes a transparent gas barrier film and a transparent conductive layer in this order from outside toward inside. In the laminate, the transparent gas barrier film has a b* value of more than 0 in the L*a*b* color system, and the transparent conductive layer contains PEDOT/PSS and has a b* value of less than 0 in the L*a*b* color system. Even though the transparent gas barrier film has a yellowish hue, the transparent conductive layer, which contains PEDOT/PSS having a bluish hue, may exert an overall effect of reducing the yellowish hue when the transparent conductive gas barrier laminate is observed and may even exert an effect of imparting a bluish hue to the laminate.

ITO films based on conventional art for use as transparent conductive films tend to have a yellowish hue as mentioned above. ITO films tend to cause fine cracks as a result of repeating input operations, and also suffer from low bending resistance. In addition to this, formation of ITO films involves vacuum processing, such as deposition or sputtering, which incurs enormous capital investment and needs a large site area that is difficult to obtain. Furthermore, indium, which is a rare metal, suffers from depletion of resources and generates a concern that stable supply may be affected by the international situation. In this regard, use of PEDOT/PSS as a material for forming a transparent conductive layer can eliminate these issues. PEDOT/PSS has good electrical conductivity, flexibility and transparency. Transparent conductive layers containing PEDOT/PSS can be applied by using a wet coating method and thus are superior to ITO films from the perspective of cost.

PEDOT/PSS, which is an organic material, has lower resistance to ultraviolet rays (with a wavelength of 300 nm to 400 nm) compared to inorganic materials. Therefore, if devices including the transparent conductive gas barrier laminate are used under environments of being exposed to ultraviolet (UV) rays or used in fields requiring high reliability, the laminate may preferably have ultraviolet shielding properties. When ultraviolet shielding properties are imparted to the transparent conductive gas barrier laminate, deterioration may be minimized in the driven unit to be protected by the laminate.

For example, ultraviolet shielding properties may be imparted to the transparent conductive gas barrier laminate by using a transparent gas barrier film having ultraviolet shielding properties. More specifically, the laminate may include a transparent base film having ultraviolet shielding properties, or may include a layer having ultraviolet shielding properties (e.g., layer containing a UV absorber), as the adhesive layer, interposed between two pairs of films, each pair being a transparent base film and a silicon oxide-deposited film. Alternatively, the transparent conductive gas barrier laminate may further include a transparent resin film having ultraviolet shielding properties on the outside of the transparent conductive layer, or may include a layer having ultraviolet shielding properties (e.g., layer containing a UV absorber), as the adhesive layer, interposed between the transparent resin film having ultraviolet shielding properties and a film adjacent to the transparent resin film.

The transparent conductive gas barrier laminate may further include a coating layer on the outermost side thereof. For example, by forming a coating layer having a pencil hardness of 2H or more, crack resistance can be imparted to the outermost surface. The coating layer may be one that imparts stain resistance and/or chemical resistance to the outermost surface.

An aspect of the present disclosure is a device including the transparent conductive gas barrier laminate described above, and a driven unit that is disposed so as to face the transparent conductive layer of the transparent conductive gas barrier laminate. The driven unit of this device is protected by the transparent gas barrier film and driven via the transparent conductive layer.

Advantageous Effects of the Invention

According to the present disclosure, there are provided a transparent conductive gas barrier laminate in which a yellowish hue has been sufficiently reduced, and a device including the laminate.

BRIEF DESCRIPTION OF THE DRAWINGS

FIGS. 1A and 1B are sets of schematic cross-sectional views in which

FIGS. 2A and 2B are sets of schematic cross-sectional views in which FIG. 1A illustrates an example of a configuration of a transparent gas barrier film, and FIG. 1B illustrates another example of a configuration of a transparent gas barrier film.

FIGS. 4A and 4B are sets of schematic cross-sectional views in which

FIGS. 5A and 5B are sets of schematic cross-sectional views in which

FIGS. 6A and 6B are sets of schematic cross-sectional views in which

DETAILED DESCRIPTION OF REPRESENTATIVE EMBODIMENTS

With reference to the drawing, a description will now be given of representative embodiments according to the present invention. The present invention is not limited to the following representative embodiments, and appropriate modifications can be made without departing from the spirit of the present invention. The representative embodiments described below are merely examples of the present invention, and the design thereof could be appropriately changed by one skilled in the art. Here, the drawing is schematic, and the relationship between thickness and plane size, the ratio of the thickness of each layer, etc., are different from actual ones. The embodiments described below are merely examples of the configurations for embodying the technical idea of the present invention, and the technical idea of the present invention should not limit the materials, shapes, structures, and the like of the components to those described below. The technical idea of the present invention can be modified in various ways within the technical scope specified by the claims.

The same constituent elements are denoted by the same reference numerals unless there is a reason for the sake of convenience, and redundant description is omitted. In the drawings referred to in the following description, for clarity, characteristic parts are enlarged, and thus the components are not shown to scale. It is, however, clear that one or more embodiments can be implemented without such details. In addition, known structures and devices may be schematically represented for simplicity.

First Embodiment

Figure 1A:
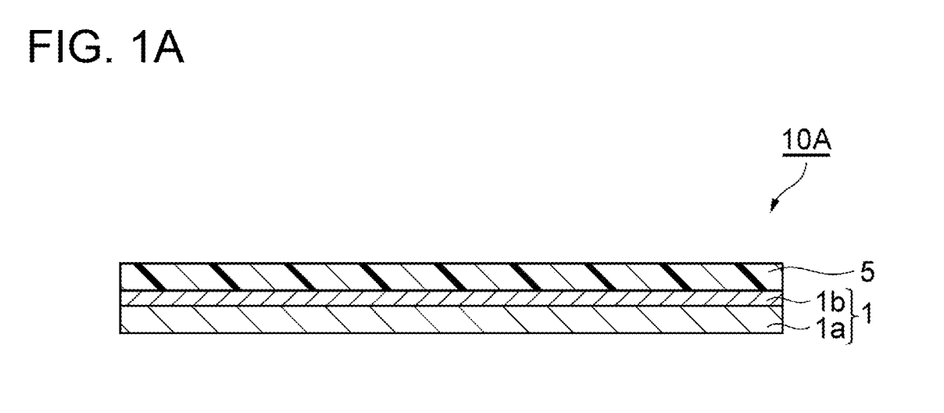
FIG. 1A illustrates a first embodiment of a transparent conductive gas barrier laminate according to the present disclosure.

FIG. 1A illustrates a transparent conductive gas barrier laminate (which may be simply termed "laminate" hereinafter) 10A which includes a transparent gas barrier film 1 and a transparent conductive layer 5 in this order from outside (lower side in the figure) toward inside (upper side in the figure) of the laminate. As shown in FIG. 1A, the transparent gas barrier film 1 in the laminate 10A is configured by a transparent base film 1a and a barrier layer 1b which are laminated in this order from outside toward inside. The order of lamination is not limited to this but may be the order as in the configuration of a laminate 10B shown in FIG. 1B. The laminate 10B has a layer configuration in which a barrier layer 1b is formed on a surface of a transparent base film 1a, and a transparent conductive layer 5 is formed on the other surface thereof.

Figure 1B:
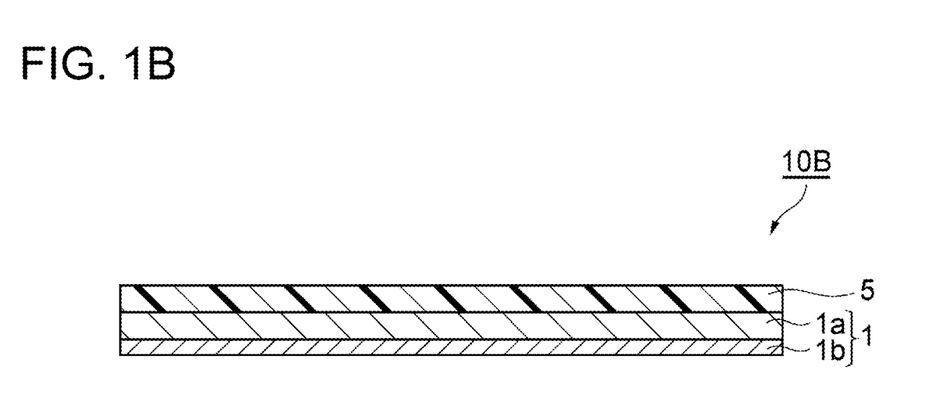
FIG. 1B illustrates a modification of the first embodiment.

The transparent gas barrier film 1 has a b* value of more than 0 in the L*a*b* color system. The transparent conductive layer 5 contains a conductive polymer, and has a b* value of less than 0 in the L*a*b* color system. By combining the transparent gas barrier film 1 having a yellowish hue with the transparent conductive layer 5 having a bluish hue, the yellowish hue of the transparent gas barrier film 1 is reduced by the bluish hue of the transparent conductive layer 5. In other words, in the obtained laminate 10A or 10B, the yellowish hue can be sufficiently reduced.

The transparent gas barrier film 1 may have b* of more than 0 in the L*a*b* color system (i.e. may have a yellowish hue). The transparent gas barrier film 1 may have a configuration including the transparent base film 1a and the barrier layer 1b which is formed on a surface of the transparent base film 1a. The transparent gas barrier film 1 may have a yellowish hue that is ascribable to one or both of the transparent base film 1a and the barrier layer 1b. However, since a sufficiently colorless and transparent film is comparatively easily available as the transparent base film 1a, the yellowish hue of the transparent gas barrier film 1 is assumed to be ascribable to the barrier layer 1b.

The transparent gas barrier film 1 may have b* of more than 0, or more than 0 and 2.5 or less, or may have b* in the range of 0.5 to 2.0, or 0.5 to 1.5. If the transparent gas barrier film 1 has a b* value of 2.5 or less, the yellowish hue of the transparent conductive gas barrier laminate 10A can be sufficiently reduced by the bluish hue of the transparent conductive layer 5.

It is preferred that a sufficiently colorless and transparent film is used as the transparent base film 1a. The transparent base film 1a preferably has a total light transmittance of 85% or more. As the transparent base film 1a, for example, a film having high transparency and good heat resistance may be used. Such a film may be a polyethylene terephthalate film (PET film), a polyethylene naphthalate film, or the like. The transparent base film 1a may preferably have a thickness in the range of 9 μm to 50 μm, and more preferably 12 μm to 30 μm. If the transparent base film 1a has a thickness of 9 μm or more, the strength of the transparent base film 1a can be sufficiently ensured, and if 50 μm or less, a long roll (roll of the transparent gas barrier film 1) can be produced efficiently and economically.

Figure 2A:
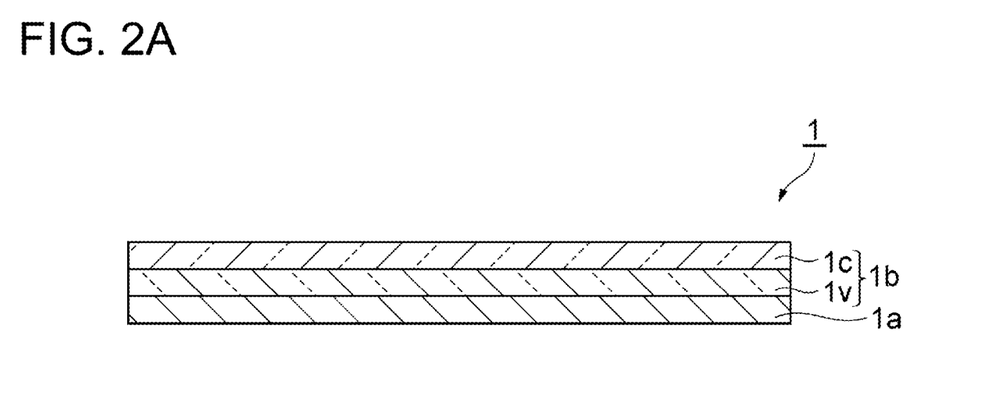
Figure 2B:
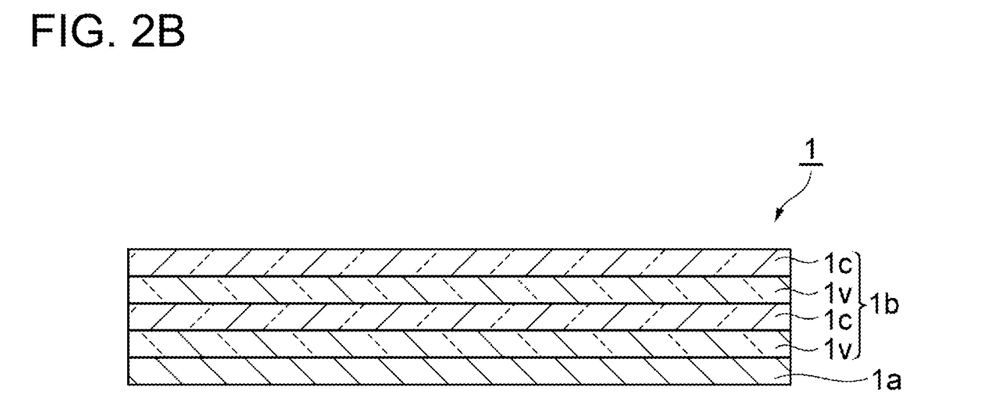

As shown in FIG. 2A, for example, the barrier layer 1b is configured by a vapor-deposited layer 1v and a gas barrier covering layer 1c. Specifically, the barrier layer 1b has a configuration in which a vapor-deposited layer 1v is provided on a surface of a transparent resin film 1a, and a gas barrier covering layer 1c is provided on the vapor-deposited layer 1v. As shown in FIG. 2B, for example, the barrier layer 1b may be configured by an alternation of vapor-deposited layers 1v and gas barrier coating layers 1c. Although not shown, barrier layers 1b may be respectively formed on both surfaces of a transparent base film 1a. To improve adhesion between the transparent base film 1a and the vapor-deposited layer 1v, the surface of the transparent base film 1a may be treated, e.g., plasma-treated, or may be provided with an acrylic resin layer, an anchor coat layer made of a polyester resin, a urethane resin, or the like.

The vapor-deposited layer 1v may be formed, for example, by vapor-depositing aluminum oxide, silicon oxide, silicon oxynitride, magnesium oxide, or a mixture thereof on the transparent base film 1a. Of these inorganic materials, aluminum oxide or silicon oxide is preferably used from the perspective of barrier properties and productivity. The vapor-deposited layer is formed by vacuum vapor deposition, sputtering, CVD, or the like. As described above, according to the research conducted by the inventors of the present invention, if a vapor-deposited layer of silicon oxide is formed, for example, by vacuum vapor deposition, the resultantly obtained vapor-deposited layer 1v is likely to have a yellowish hue.

The vapor-deposited layer 1v preferably has a thickness (film thickness) in the range of 5 nm to 500 nm, and more preferably 10 nm to 100 nm. If the film thickness is 5 nm or more, a uniform film is easily formed, and the film is likely to more sufficiently serve as a gas barrier member. If the film thickness is 500 nm or less, there is a tendency that sufficient flexibility can be maintained, and that the resultant thin film is more reliably prevented from being cracked due to external factors, such as bending or stretching, after being formed.

The gas barrier covering layer 1c is provided for the purpose of preventing various types of secondary damage in the post processing and imparting higher barrier properties to the laminate. From the perspective of obtaining good barrier properties, the gas barrier covering layer 1c preferably contains at least one component selected from the group consisting of hydroxyl group-containing polymer compound, metal alkoxide, metal alkoxide hydrolysate and metal alkoxide polymer.

Specific examples of the hydroxyl group-containing polymer compound include water-soluble polymers, such as polyvinyl alcohol, polyvinyl pyrrolidone, and starch. Particularly, the best barrier properties are obtained when polyvinyl alcohol is used.

The metal alkoxide is a compound represented by a general formula: $M(OR)_n$ (where M represents a metal atom such as Si, Ti, Al or Zr, R represents an alkyl group such as —CH3 or —$C_2H_5$, and n represents an integer corresponding to a valence of M). Specifically, such a compound may be tetraethoxysilane [$Si(OC_2H_5)_4$], triisopropoxy aluminum [$Al(O-iso-C_3H_7)_3$], or the like. Tetraethoxysilane or triisopropoxy aluminum is preferred because they are relatively stable in an aqueous solvent after being hydrolyzed. The hydrolyzed or polymerized metal alkoxide may, for example, be silicic acid ($Si(OH)_4$) as hydrolyzed or polymerized tetraethoxysilane, or aluminum hydroxide ($Al(OH)_3$) as hydrolyzed or polymerized triisopropoxy aluminum.

The gas barrier covering layer 1c preferably has a thickness (film thickness) in the range of 50 nm to 1,000 nm, and more preferably 100 nm to 500 nm. If the film thickness is 50 nm or more, more sufficient gas barrier properties are likely to be obtained, and if 1,000 nm or less, sufficient flexibility is likely to be maintained.

The transparent conductive layer 5, which contains a conductive polymer, has electrical conductivity and has a bluish hue. The transparent conductive layer 5 may have b* of less than 0 (i.e. may have a negative value), preferably less than 0 and −5.0 or more, more preferably in the range of −1.0 to −3.0, and even more preferably −1.0 to −2.0. If the transparent conductive layer 5 has a b* value of less than −5.0, the bluish color may tend to allow the laminate 10A or 10B to be excessively blue. From the perspective of obtaining a laminate 10A or 10B having a sufficiently reduced yellowish hue or having a bluish hue, the transparent conductive layer 5 may preferably have b* whose absolute value is larger than that of the b* of the transparent gas barrier film 1. Specifically, the ratio of the absolute value of b* of the transparent conductive layer 5 (B5) to the value of b* of the transparent gas barrier film 1 (B1) as expressed by (B5/B1) is preferably more than 1, and more preferably in the range of 2.0 to 4.0.

The transparent conductive layer 5 preferably has a thickness (film thickness) in the range of 0.1 μm to 2.0 μm, and more preferably 0.1 μm to 0.4 μm. If the film thickness is 0.1 μm or more, a uniform film is easily formed, and the film is likely to more sufficiently serve as a conductive layer. If the film thickness is 2.0 μm or less, there is a tendency that sufficient flexibility can be maintained, and that the resultant thin film is more reliably prevented from being cracked due to external factors, such as bending or stretching, after being formed. For example, the transparent conductive layer 5 may have a sheet resistance in the range of 100Ω/□ to 1,000Ω/□, preferably 100Ω/□ to 500Ω/□, and more preferably 100Ω/□ to 150Ω/□. The sheet resistance of the transparent conductive layer 5 can be measured, for example, by using a Loresta-GP MCP-T610 (trade name, manufactured by Mitsubishi Chemical Analytech Co., Ltd.).

The transparent conductive layer 5 can be formed, for example, by applying a coating liquid that contains a conductive polymer having a bluish hue. As a specific example of the conductive polymer having a bluish hue, a mixture of polyethylene dioxythiophene (PEDOT) and polystyrene sulfonic acid (PSS) (PEDOT/PSS) may be mentioned. The degree of blue of the transparent conductive layer 5 may be controlled, for example, by controlling the thickness of the transparent conductive layer 5, or controlling the polymerization degree of the conductive polymer. If the material forming the transparent conductive layer 5 is colorless and transparent or has insufficient degree of blue, a blue pigment or the like may be added to the coating liquid to an extent not hampering electrical conductivity. The transparent conductive layer 5 may be formed so as to entirely cover the transparent gas barrier film 1 (so-called solid coating), or may be formed into a pattern.

Figure 3:
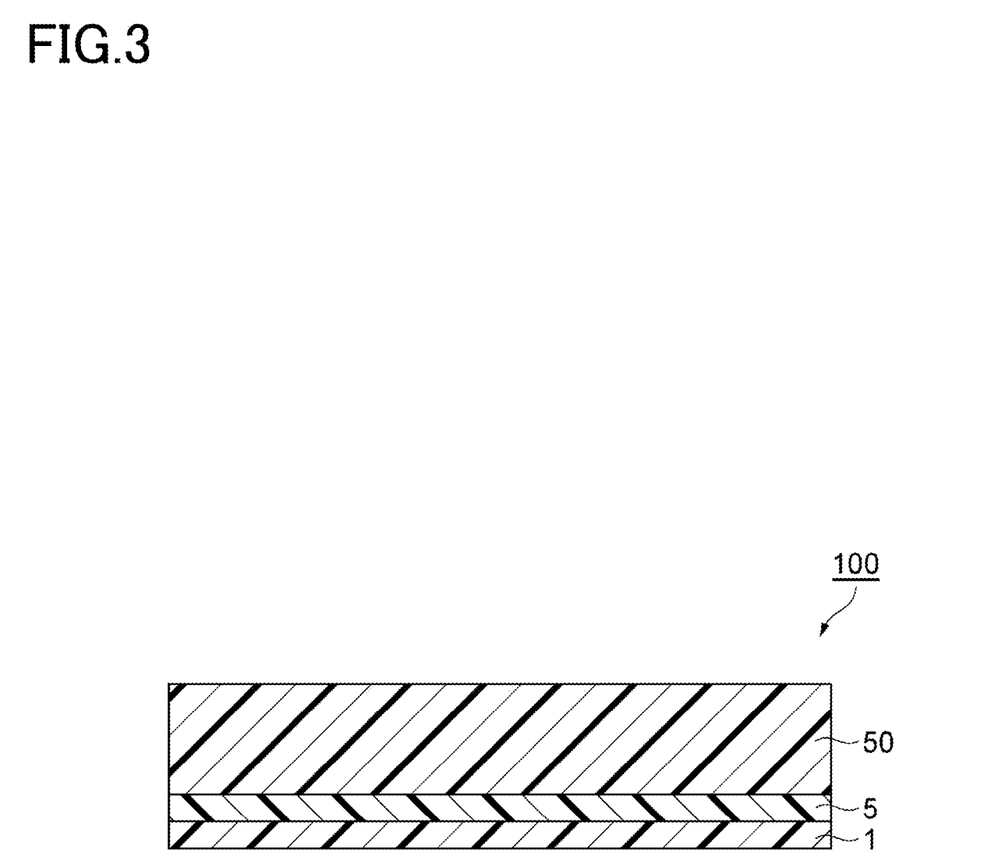
FIG. 3 is a schematic cross-sectional view illustrating an embodiment of a device including a transparent conductive gas barrier laminate.

FIG. 3 shows a device 100 which includes a transparent gas barrier film 1, a transparent conductive layer 5, and a driven unit 50. Specifically, for example, the device 100 may be electronic paper, an electrochromic device, an organic or inorganic electroluminescent device, or other organic semiconductor devices. As shown in FIG. 3, the driven unit 50 is disposed so as to face the transparent gas barrier film 1 via the transparent conductive layer 5. The driven unit 50 is protected by the transparent gas barrier film 1 and driven via the transparent conductive layer 5.

Second Embodiment

Figure 4A:
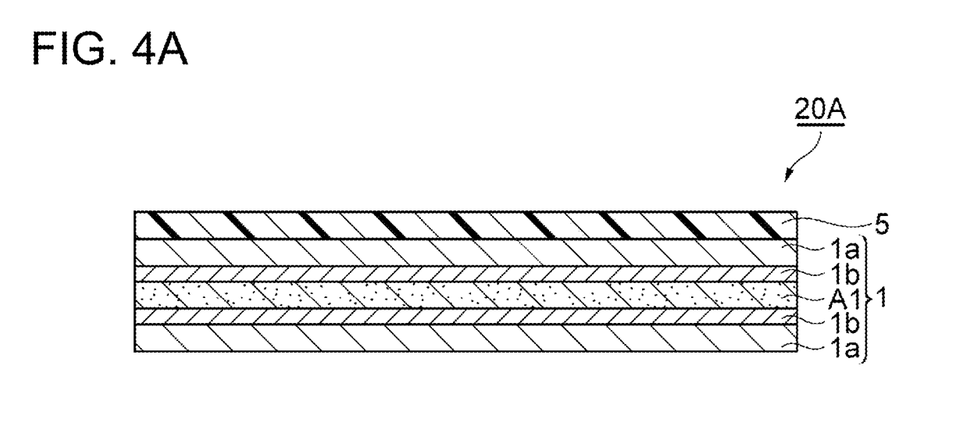
FIG. 4A illustrates a second embodiment of the transparent conductive gas barrier laminate according to the present disclosure.
Figure 4B:
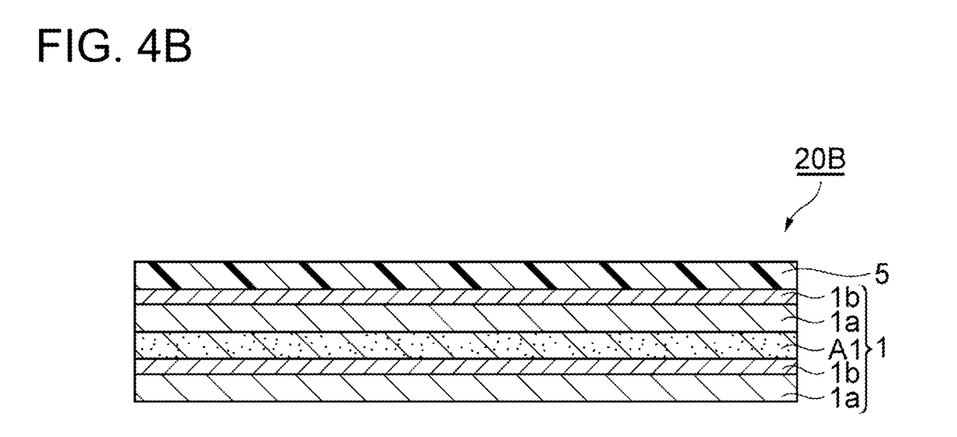
FIG. 4B illustrates a modification of the second embodiment.

FIGS. 4A and 4B are sets of schematic cross-sectional views in which FIG. 4A illustrates a second embodiment of the transparent conductive gas barrier laminate according to the present disclosure, and FIG. 4B illustrates a modification of the second embodiment. These Figures respectively show laminates 20A and 20B each having a transparent gas barrier film 1 which includes two pairs of a transparent base film 1a and a barrier layer 1b, and an adhesive layer A1 interposed between the two pairs. The transparent gas barrier film 1 having such a configuration can contribute to achieving much better gas barrier properties.

In the laminate 20A shown in FIG. 4A, the two pairs are laminated so that the respective barrier layers 1b will face each other. A transparent conductive layer 5 is formed on a surface of the transparent base film 1a of one pair (upper pair as viewed in the figure). In the laminate 20B shown in FIG. 4B, the two pairs are laminated so that the barrier layer 1b of one pair (lower pair as viewed in the figure) will face the transparent base film 1a of the other pair (upper pair as viewed in the figure). A transparent conductive layer 5 is formed on a surface of the barrier layer 1b of the upper pair.

The adhesive layer A1 is formed of an adhesive or a tackifier. The adhesive may be an acrylic adhesive, an epoxy-based adhesive, a urethane-based adhesive, or the like. The tackifier may be an acrylic tackifier, a polyvinyl ether-based tackifier, a urethane-based tackifier, a silicone-based tackifier, or the like. Among them, an acrylic tackifier is particularly preferred because of having high transparency and good heat resistance. The adhesive layer A1 preferably has a thickness in the range of 0.5 μm to 50 μm, more preferably 1 μm to 20 μm, and even more preferably 2 μm to 6 μm.

The adhesive that forms the adhesive layer A1 may be one having oxygen barrier properties. In this case, the adhesive layer A1 with a thickness of 5 μm may have an oxygen permeability, for example, of 1,000 $cm^3/(m^2 \cdot day \cdot atm)$ or less in the thickness direction. The oxygen permeability is preferably 500 $cm^3/(m^2 \cdot day \cdot atm)$ or less, more preferably 100 $cm^3/(m^2 \cdot day \cdot atm)$ or less, even more preferably 50 $cm^3/(m^2 \cdot day \cdot atm)$ or less, and particularly preferably 10 $cm^3/(m^2 \cdot day \cdot atm)$ or less. If the adhesive layer A1 has an oxygen permeability of 1,000 $cm^3/(m^2 \cdot day \cdot atm)$ or less, the defects, if any, of the barrier layer 1b can be mitigated. The lower limit of the oxygen permeability is not particularly limited, but may, for example, be 0.1 $cm^3/(m^2 \cdot day \cdot atm)$.

The adhesive layer A1 may preferably have ultraviolet shielding properties, from the perspective of preventing the conductive polymer contained in the transparent conductive layer 5 and/or the driven unit 50 from being deteriorated by ultraviolet rays. Specifically, it is preferred that the adhesive layer A1 contains an ultraviolet absorber. The ultraviolet absorber may be one that contains a benzotriazole-based compound, a benzophenone-based compound, or a triazine-based compound. A commercially available product Tinuvin (trademark) 400 (manufactured by BASF SE) may be used.

Third Embodiment

Figure 5A:
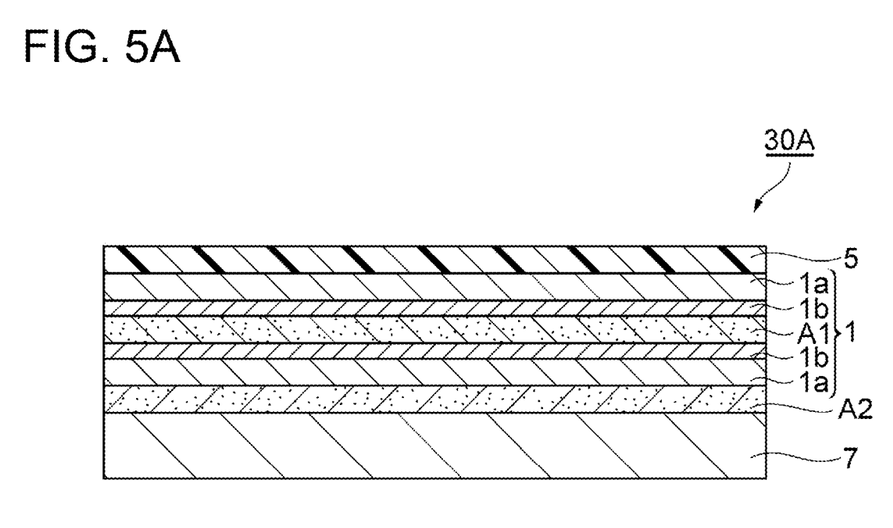
FIG. 5A illustrates a third embodiment of the transparent conductive gas barrier laminate according to the present disclosure.
Figure 5B:
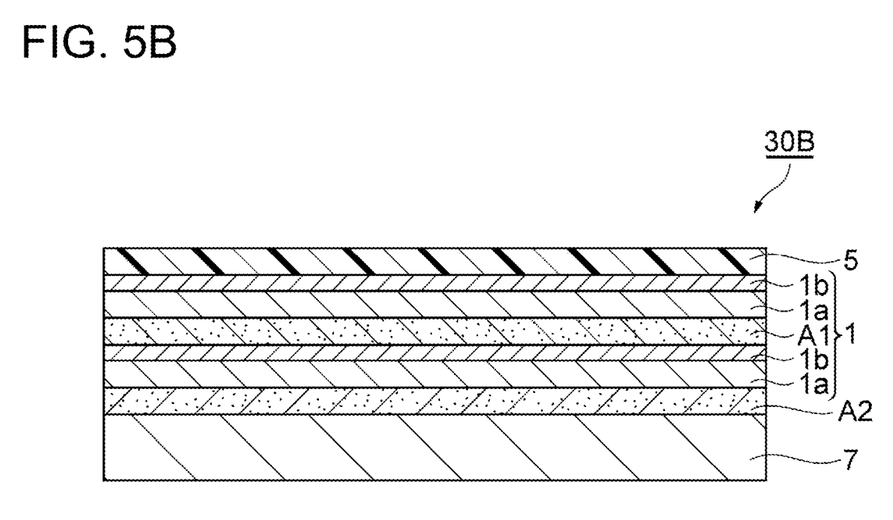
FIG. 5B illustrates a modification of the third embodiment.

FIGS. 5A and 5B of schematic cross-sectional views in which FIG. 5A illustrates a third embodiment of the transparent conductive gas barrier laminate according to the present disclosure, and FIG. 5B illustrates a modification of the third embodiment. These Figures respectively show laminates 30A and 30B which are different from the laminates 20A and 20B described above in that the laminates 30A and 30B each include a transparent resin film 7 additionally adhered thereto via an adhesive layer A2. As necessary, the adhesive layer A2 may adequately have a configuration similar to that of the adhesive layer A1 (in terms of type, thickness, oxygen barrier properties, and ultraviolet shielding properties).

The transparent resin film 7 may preferably have a total light transmittance of 85% or more, although not particularly limited thereto. For example, polyethylene terephthalate films, polyethylene naphthalate films, or the like having high transparency and good heat resistance may be used. Films having ultraviolet shielding properties may also be used as the transparent resin film 7.

The transparent resin film 7 may have a thickness, for example, in the range of 10 μm to 250 μm, preferably 25 μm to 240 μm, more preferably 40 μm to 210 μm, and even more preferably 55 μm to 200 μm. If the transparent conductive layer 5 is patterned, instead of being a uniform coating, the transparent resin film 7 with a thickness of 10 μm or more can make the pattern not be easily visible from outside. If the thickness of the transparent resin film 7 is 250 μm or less, the total thickness of the laminate 30A or 30B is prevented from becoming excessively large.

Fourth Embodiment

Figure 6A:
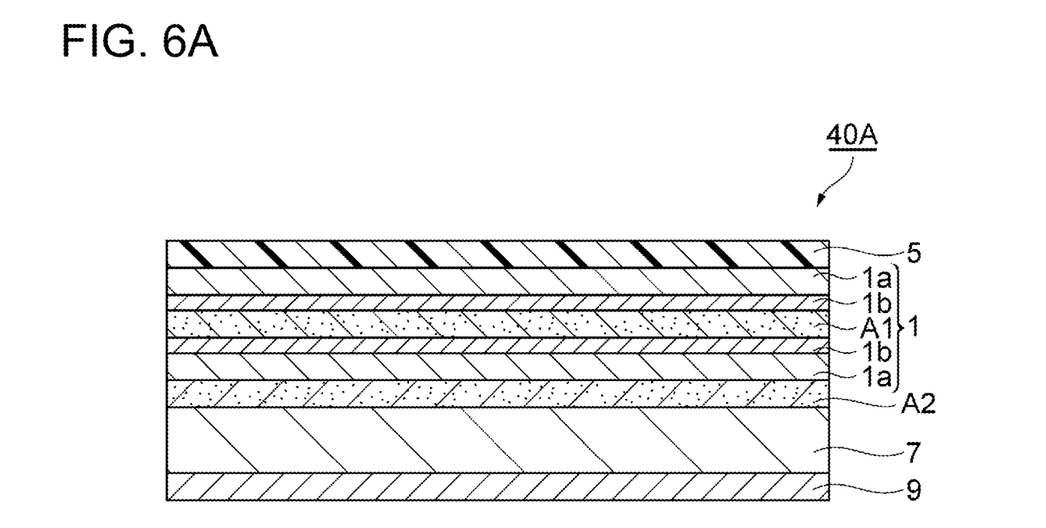
FIG. 6A illustrates a fourth embodiment of the transparent conductive gas barrier laminate according to the present disclosure.
Figure 6B:
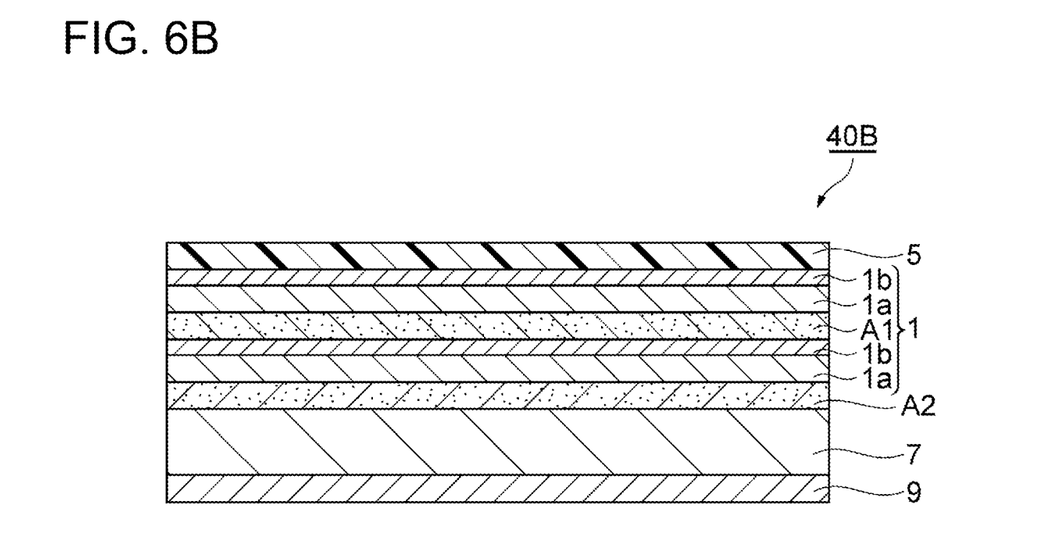
FIG. 6B illustrates a modification of the fourth embodiment.

FIGS. 6A and 6B are sets of schematic cross-sectional views in which FIG. 6A illustrates a fourth embodiment of the transparent conductive gas barrier laminate according to the present disclosure, and FIG. 6B illustrates a modification of the fourth embodiment. These Figures respectively show laminates 40A and 40B which are different from the laminates 30A and 30B described above in that the laminates 40A and 40B each have a coating layer 9 that is additionally formed on the outer side of the transparent resin film 7.

As the coating layer 9, for example, one that contains a curing material and a leveling material as binder matrix components may be used. Use of a coating layer 9 mainly formed of a curing material may allow the coating layer 9 to serve as a hard coating. Thus, the laminate 40A or 40B can have a surface hardness corresponding to a pencil hardness of H or more (more preferably 2H or more). The coating layer 9 may be one that imparts stain resistance and/or chemical resistance to the outermost surface. A conductive material may be added to the coating layer 9 to impart antistatic properties thereto.

The coating layer 9 may have a thickness, for example, in the range of 40 μm to 120 μm, preferably 50 μm to 100 μm, and more preferably 60 μm to 80 μm. The coating layer 9 having a thickness of 40 μm or more easily allows the coating layer 9 to sufficiently exert its performance, and makes the pattern, if any, of the transparent conductive layer 5 not easily visible from outside. If the coating layer 9 has a thickness of 120 μm or less, the total thickness of the laminate 40A or 40B is easily prevented from becoming excessively large.

The present embodiment has exemplified a configuration in which the coating layer 9 is formed on the outside of the transparent resin film 7. However, the configuration may be such that the coating layer 9 is formed on the surface of the transparent base film 1a which is on the outside of the laminate 20A or 20B of the second embodiment. Also, the present embodiment has described that the adhesive layers A1 and A2 may have ultraviolet shielding properties. However, for example, each transparent base film 1a may be one having ultraviolet shielding properties so that the ultraviolet shielding properties can be imparted to the transparent gas barrier film 1. By imparting ultraviolet shielding properties to the transparent gas barrier film 1, the transparent conductive layer 5 can be protected from ultraviolet rays and thus increase of sheet resistance over time can be minimized.

<Method of Producing Transparent Conductive Gas Barrier Laminate>

The transparent conductive gas barrier laminates according to the embodiments described above can be produced, for example, by roll-to-roll processing. First, a transparent gas barrier film 1 is prepared. Specifically, a vapor-deposited layer 1v is laminated by vacuum deposition on a surface of a transparent base film 1a. Subsequently, a coating agent containing a main agent is prepared. The main agent is an aqueous solution or water/alcohol mixed solution that contains at least one component or the like selected from the group consisting of hydroxyl group-containing polymer compounds, metal alkoxides, hydrolyzed metal alkoxides, and polymerized metal alkoxides. The coating agent containing the main agent is applied to the surface of the vapor-deposited layer 1v, followed by drying at 80° C. to 250° C., for example, thereby forming a gas barrier covering layer 1c. The obtained laminate film may be singly used as a transparent gas barrier film 1 (first embodiment), or may be bonded to another such laminate film via an adhesive layer A1 for use as a transparent gas barrier film 1.

A transparent conductive layer 5 may be formed on the inner surface of the transparent gas barrier film 1, or, as necessary, a transparent film 7 may be bonded to the outer surface thereof via an adhesive layer A2, or a coating layer 9 may be further formed on the outside of the transparent resin film 7 to obtain a transparent conductive gas barrier laminate of an embodiment described above.

Some embodiments of the present disclosure have so far been specifically described. However, the technical scope of the present invention should not be limited to these embodiments, but may be modified variously without departing from the spirit of the present invention.

EXAMPLES

The present invention will be more specifically described below based on Examples and Comparative Examples; however, the present invention should not be limited to the following Examples. In Examples and Comparative Examples, b* in the L*a*b* color system, total light transmittance, moisture permeability, and sheet resistance were measured as follows.

(1) b* in the L*a*b* Color System

Using UV-2450 (trade name, manufactured by Shimadzu Corporation), spectral transmittance of a target film was measured. From the results of measurement, tristimulus values X, Y and Z of the object color based on transmission in the tristimulus values XYZ color system were calculated from the following formulas to calculate b*.

$$X = K \int P(\lambda)x(\lambda)T(\lambda)d\lambda \quad \text{[Math. 1]}$$

$$Y = K \int P(\lambda)y(\lambda)T(\lambda)d\lambda$$

$$Z = K \int P(\lambda)z(\lambda)T(\lambda)d\lambda$$

$$K = \frac{100}{\int P(\lambda)x(\lambda)T(\lambda)d\lambda}$$

$x(\lambda), y(\lambda),$ $z(\lambda)$: Color-matching functions in XYZ color system $T(\lambda)$: Spectral transmittance $P(\lambda)$: Spectral distribution of standard light $$b^* = 200\left[\left(\frac{Y}{Yn}\right)^{1/3} - \left(\frac{Z}{Zn}\right)^{1/3}\right]$$

$Yn, Zn$: Tristimulus values of perfect diffusion reflector in each field of view of illuminant (2) Total Light Transmittance Based on a method of measurement according to JIS K 7361-1 (ISO13468-1) and using a haze meter (trade name: HM-150 manufactured by Murakami Color Research Laboratory Co., Ltd.), total light transmittance was measured.

(3) Moisture Permeability

Based on an infrared sensor method according to JIS K 7129 and using a moisture permeability measuring device (trade name: Permatran, manufactured by MOCON Inc.), moisture permeability was measured under conditions of 40° C. transmission cell temperature, 90% RH in a high humidity chamber, and 0% RH in a low humidity chamber.

(4) Sheet Resistance

Using a Loresta-GP MCP-T610 (trade name, manufactured by Mitsubishi Chemical Analytech Co., Ltd.), sheet resistances (early stage and after UV exposure) of the transparent conductive layer were measured. Ultraviolet rays were irradiated from the transparent gas barrier film side toward the transparent conductive layer for 2,000 hours.

Example 1

A transparent gas barrier film was prepared as follows. First, an acrylic resin coating liquid was applied to a surface of a PET film, as a transparent base film, having a thickness of 23 μm and dried to form an anchor coat layer. Then, silicon oxide was vacuum-deposited on the anchor coat layer so as to have a thickness of 30 nm to provide a vapor-deposited layer. Furthermore, a gas barrier covering layer having a thickness of 300 nm was formed on the vapor-deposited layer. The gas barrier covering layer was formed by a wet coating method by applying a coating liquid which contained tetraethoxysilane and polyvinyl alcohol. Thus, a transparent gas barrier film was obtained, with a barrier layer being provided on one surface of the transparent base film. The barrier layer in this case was formed of a pair of a silicon oxide-deposited layer and a gas barrier covering layer (see FIG. 2A).

On the gas barrier covering layer of the transparent gas barrier film obtained as described above, a transparent conductive layer having a thickness of 400 nm was further formed to produce a transparent conductive gas barrier laminate (see FIG. 1A). The transparent conductive layer was formed by a wet coating method by applying a coating liquid that contained PEDOT/PSS (manufactured by Nagase ChemteX Corporation). The transparent conductive layer had a sheet resistance of 150Ω/□. It should be noted that, on a surface of a transparent film (b*=0), only a transparent conductive layer having a thickness of 400 nm was formed in a manner similar to the present example to produce a laminate formed of the transparent film and the transparent conductive layer.

Example 2

A transparent conductive gas barrier laminate was formed as in Example 1 except that a transparent conductive layer was formed on the other surface of the transparent base film, instead of forming a transparent conductive layer on the gas barrier covering layer (see FIG. 1B).

Example 3

Two transparent gas barrier films were prepared as in Example 1. The two transparent gas barrier films were bonded to each other such that the respective gas barrier covering layers face each other to thereby obtain a transparent gas barrier film having a multilayer structure. On a surface of the transparent barrier film (on a surface of the PET film) obtained as described above, a transparent conductive layer was formed as in Example 1 to produce a transparent conductive gas barrier laminate (see FIG. 4A).

For bonding the two transparent barrier films, an adhesive layer (oxygen permeability under 30° C. 70% RH environment: 5 cm³/m²·day·atm) having a cured thickness of 5 μm was formed using a two-part epoxy adhesive comprising an epoxy resin as a base resin and an amine-based curing agent. Oxygen permeability of the adhesive layer was measured as follows. On an OPP film having a thickness of 20 μm (oxygen permeability under a 30° C. and 70% RH environment: 3,000 cm³/m²·day·atm (measurement limit) or more), a film of the two-part epoxy adhesive was formed so as to have a cured thickness of 5 μm to thereby prepare an evaluation sample. Oxygen permeability of the sample was measured under a 30° C. and 70% RH environment according to the method described in JIS K7126A by using a differential pressure gas meter (GTR-10X, manufactured by GTR Tec Corporation).

Example 4

A transparent gas barrier film having a multilayer structure was formed as in Example 3 except that two transparent gas barrier films were bonded to each other such that the gas barrier covering layer of one transparent gas barrier film faced the PET film of the other transparent gas barrier film, instead of bonding the two transparent gas barrier films such that the respective gas barrier covering layers faced each other. On a surface of the transparent gas barrier film (on a surface of the gas barrier covering layer) obtained as described above, a transparent conductive layer was formed as in Example 1 to produce a transparent conductive gas barrier laminate (see FIG. 4B).

Example 5

A transparent conductive gas barrier laminate was produced as in Example 3 except that a UV absorber (manufactured by BASF SE) was added to the adhesive used for bonding the two transparent barrier films (see FIG. 4A). The amount of addition of the UV absorber was 1.5 parts by mass relative to the 100 parts by mass adhesive.

Example 6

A transparent conductive gas barrier laminate was produced as in Example 4 except that a UV absorber (manufactured by BASF SE) was added to the adhesive used for bonding the two transparent barrier films (see FIG. 4B). The amount of addition of the UV absorber was 1.5 parts by mass relative to the 100 parts by mass adhesive.

Examples 7 to 10

Transparent conductive gas barrier laminates were respectively produced as in Examples 3 to 6 except that transparent resin films were further bonded to the outer surfaces (PET films) of the respective laminates having the same configurations as those of the transparent conductive gas barrier laminates produced in Examples 3 to 6 (see FIG. 5A or 5B). PET films (each having a thickness of 50 manufactured by Teijin DuPont Films) having ultraviolet shielding properties were used as the transparent resin films. As the adhesive forming the adhesive layers, an adhesive that was the same as that used in Example 3 was used.

Examples 11 and 12

Transparent conductive gas barrier laminates were respectively produced as in Examples 9 and 10 except that the transparent resin films were bonded to the respective laminates via adhesive layers containing a UV absorber (see FIG. 5A or 5B). As the adhesive forming the adhesive layers, an adhesive that was the same as that used in Examples 5 and 6 was used.

Examples 13 to 18

Transparent conductive gas barrier laminates were respectively produced as in Examples 7 to 12 except that coating layers, each having a thickness of 8 were formed on the outer surfaces (surfaces of the respective transparent resin films) of the respective laminates having the same configurations as those of the transparent conductive gas barrier laminates produced in Examples 7 to 12 (see FIG. 6A or 6B). The coating layers were formed by a wet coating method by applying a coating liquid that contained a photosensitive monomer and a photoinitiator, followed by curing by irradiating ultraviolet rays. The coating layers each had a pencil hardness of 2H.

Comparative Example 1

A laminate having the same configuration as that of the transparent conductive gas barrier laminate (see FIG. 4A) of Example 3 was produced as in Example 3 except that no transparent conductive layer was formed.

Comparative Example 2

A laminate having the same configuration as that of the transparent conductive gas barrier laminate (see FIG. 6A) of Example 17 was produced as in Example 17 except that no transparent conductive layer was formed.

Examples 19 to 36

Transparent conductive gas barrier laminates were respectively produced as in Examples 1 to 18 except that barrier layers, each including two pairs of films, each pair being a silicon oxide-deposited layer and a gas barrier covering layer (see FIG. 2B), were formed on the respective transparent base films, instead of forming barrier layers, each including one pair of a silicon oxide-deposited layer and a gas barrier covering layer, thereon.

Comparative Examples 3 and 4

Laminates were respectively produced as in Comparative Examples 1 and 2 except that barrier layers, each including two pairs of films, each pair being a silicon oxide-deposited layer and a gas barrier covering layer (see FIG. 2B), were formed on the respective transparent base films, instead of forming barrier layers, each including one pair of a silicon oxide-deposited layer and a gas barrier covering layer, thereon.

Examples 37 to 54

Transparent conductive gas barrier laminates were respectively produced as in Examples 1 to 18 except that transparent base films (manufactured by Teijin Film Solutions Limited) having ultraviolet shielding properties were respectively used, instead of using transparent base films (PET films) not having ultraviolet shielding properties. It should be noted that the transparent gas barriers each had the same configuration as that shown in FIG. 2A.

Comparative Examples 5 and 6

Transparent conductive gas barrier laminates were respectively produced as in Comparative Examples 1 and 2 except that transparent base films (manufactured by Teijin Film Solutions Limited) having ultraviolet shielding properties were respectively used, instead of using transparent base films (PET films) not having ultraviolet shielding properties. It should be noted that the transparent gas barriers each had the same configuration as that shown in FIG. 2A.

Tables 1 to 3 collectively show configurations, evaluations, and the like of the laminates related to the examples and the comparative examples set forth above. It should be noted that the item "b* value of transparent gas barrier film" of Examples 3 to 18 in Table 1, Examples 21 to 36 in Table 2, and Examples 39 to 54 in Table 3 is a b* value of a transparent gas barrier film having a multilayer structure obtained by bonding two transparent barrier films to each other.

TABLE 1

|  | Configuration of laminate | UV absorber in adhesive layer | | b* value of transparent gas barrier film | b* value of entire laminate | Total light transmittance [%] | Moisture permeability [g/m² · day] | Sheet resistance [Ω/□] | |
|---|---|---|---|---|---|---|---|---|---|
|  |  | Adhesive layer A1 | Adhesive layer A2 |  |  |  |  | Earlier stage | After UV exposure |
| Example 1 | FIG. 1A | — | — | 0.29 | −1.91 | 81.2 | $500 \times 10^{-3}$ | 551 | 606 |
| Example 2 | FIG. 1B | — | — | 0.37 | −1.83 | 80.9 | $500 \times 10^{-3}$ | 779 | 857 |
| Example 3 | FIG. 4A | Absent | — | 0.67 | −1.53 | 79.6 | $3 \times 10^{-3}$ | 312 | 346 |
| Example 4 | FIG. 4B | Absent | — | 0.65 | −1.55 | 78.8 | $4 \times 10^{-3}$ | 300 | 342 |
| Example 5 | FIG. 4A | Present | — | 0.69 | −1.51 | 78.1 | $3 \times 10^{-3}$ | 210 | 235 |
| Example 6 | FIG. 4B | Present | — | 0.71 | −1.49 | 78.2 | $3 \times 10^{-3}$ | 198 | 208 |
| Example 7 | FIG. 5A | Absent | Absent | 0.76 | −1.46 | 79.6 | $3 \times 10^{-3}$ | 299 | 311 |

TABLE 1-continued

| | Configuration of laminate | UV absorber in adhesive layer | | b* value of transparent gas barrier film | b* value of entire laminate | Total light transmittance [%] | Moisture permeability [g/m²·day] | Sheet resistance [Ω/□] | |
|---|---|---|---|---|---|---|---|---|---|
| | | Adhesive layer A1 | Adhesive layer A2 | | | | | Earlier stage | After UV exposure |
| Example 8 | FIG. 5B | Absent | Absent | 0.85 | −1.36 | 78.8 | $5 \times 10^{-3}$ | 294 | 350 |
| Example 9 | FIG. 5A | Present | Absent | 0.65 | −1.55 | 78.1 | $3 \times 10^{-3}$ | 196 | 225 |
| Example 10 | FIG. 5B | Present | Absent | 0.72 | −1.44 | 78.1 | $4 \times 10^{-3}$ | 197 | 227 |
| Example 11 | FIG. 5A | Absent | Present | 0.77 | −1.43 | 78.0 | $3 \times 10^{-3}$ | 181 | 210 |
| Example 12 | FIG. 5B | Absent | Present | 0.79 | −1.49 | 78.2 | $4 \times 10^{-3}$ | 184 | 212 |
| Example 13 | FIG. 6A | Absent | Absent | 0.88 | −1.26 | 78.9 | $5 \times 10^{-3}$ | 295 | 345 |
| Example 14 | FIG. 6B | Absent | Absent | 0.75 | −1.31 | 78.8 | $3 \times 10^{-3}$ | 300 | 336 |
| Example 15 | FIG. 6A | Present | Absent | 0.78 | −1.35 | 78.5 | $4 \times 10^{-3}$ | 194 | 221 |
| Example 16 | FIG. 6B | Present | Absent | 0.81 | −1.23 | 78.2 | $5 \times 10^{-3}$ | 189 | 215 |
| Example 17 | FIG. 6A | Absent | Present | 0.91 | −1.22 | 78.2 | $4 \times 10^{-3}$ | 174 | 205 |
| Example 18 | FIG. 6B | Absent | Present | 0.93 | −1.19 | 78.4 | $3 \times 10^{-3}$ | 171 | 203 |
| Comparative Example 1 | See FIG. 4A | Absent | — | — | 0.66 | 87.4 | $3 \times 10^{-3}$ | — | — |
| Comparative Example 2 | See FIG. 6A | Absent | Present | — | 4.85 | 86.9 | $103 \times 10^{-3}$ | — | — |

TABLE 2

| | Configuration of laminate | UV absorber in adhesive layer | | b* value of transparent gas barrier film | b* value of entire laminate | Total light transmittance [%] | Moisture permeability [g/m²·day] | Sheet resistance [Ω/□] | |
|---|---|---|---|---|---|---|---|---|---|
| | | Adhesive layer A1 | Adhesive layer A2 | | | | | Earlier stage | After UV exposure |
| Example 19 | FIG. 1A | — | — | 0.29 | −1.21 | 80.1 | $50 \times 10^{-3}$ | 564 | 626 |
| Example 20 | FIG. 1B | — | — | 0.37 | −1.13 | 80.9 | $50 \times 10^{-3}$ | 768 | 860 |
| Example 21 | FIG. 4A | Absent | — | 1.29 | −0.21 | 79.9 | $0.5 \times 10^{-3}$ | 304 | 344 |
| Example 22 | FIG. 4B | Absent | — | 1.28 | −0.22 | 79.8 | $0.4 \times 10^{-3}$ | 306 | 346 |
| Example 23 | FIG. 4A | Present | — | 1.34 | −0.18 | 78.9 | $0.5 \times 10^{-3}$ | 209 | 232 |
| Example 24 | FIG. 4B | Present | — | 1.33 | −0.16 | 78.7 | $0.5 \times 10^{-3}$ | 209 | 240 |
| Example 25 | FIG. 5A | Absent | Absent | 1.38 | −0.13 | 79.6 | $0.6 \times 10^{-3}$ | 306 | 343 |
| Example 26 | FIG. 5B | Absent | Absent | 1.26 | −0.24 | 79.5 | $0.4 \times 10^{-3}$ | 302 | 344 |
| Example 27 | FIG. 5A | Present | Absent | 1.24 | −0.22 | 79.5 | $0.5 \times 10^{-3}$ | 199 | 221 |
| Example 28 | FIG. 5B | Present | Absent | 1.38 | −0.14 | 79.8 | $0.5 \times 10^{-3}$ | 204 | 212 |
| Example 29 | FIG. 5A | Absent | Present | 1.39 | −0.13 | 78.8 | $0.4 \times 10^{-3}$ | 182 | 198 |
| Example 30 | FIG. 5B | Absent | Present | 1.33 | −0.19 | 78.6 | $0.5 \times 10^{-3}$ | 184 | 199 |
| Example 31 | FIG. 6A | Absent | Absent | 1.31 | −0.15 | 78.8 | $0.5 \times 10^{-3}$ | 291 | 338 |
| Example 32 | FIG. 6B | Absent | Absent | 1.27 | −0.23 | 78.8 | $0.6 \times 10^{-3}$ | 294 | 335 |
| Example 33 | FIG. 6A | Present | Absent | 1.38 | −0.13 | 78.5 | $0.3 \times 10^{-3}$ | 187 | 209 |
| Example 34 | FIG. 6B | Present | Absent | 1.25 | −0.24 | 78.6 | $0.5 \times 10^{-3}$ | 184 | 208 |
| Example 35 | FIG. 6A | Absent | Present | 1.25 | −0.23 | 78.6 | $0.4 \times 10^{-3}$ | 186 | 199 |
| Example 36 | FIG. 6B | Absent | Present | 1.37 | −0.16 | 78.3 | $0.5 \times 10^{-3}$ | 179 | 195 |
| Comparative Example 3 | See FIG. 4A | Absent | — | — | 1.23 | 86.9 | $0.3 \times 10^{-3}$ | — | — |
| Comparative Example 4 | See FIG. 6A | Absent | Present | — | 6.23 | 86.3 | $25 \times 10^{-3}$ | — | — |

TABLE 3

| | Configuration of laminate | UV absorber in adhesive layer | | b* value of transparent gas barrier film | b* value of entire laminate | Total light transmittance [%] | Moisture permeability [g/m²·day] | Sheet resistance [Ω/□] | |
|---|---|---|---|---|---|---|---|---|---|
| | | Adhesive layer A1 | Adhesive layer A2 | | | | | Earlier stage | After UV exposure |
| Example 37 | FIG. 1A | — | — | 0.34 | −1.21 | 80.1 | $490 \times 10^{-3}$ | 371 | 390 |
| Example 38 | FIG. 1B | — | — | 0.41 | −1.13 | 80.9 | $500 \times 10^{-3}$ | 502 | 532 |
| Example 39 | FIG. 4A | Absent | — | 1.22 | −0.27 | 80.1 | $2.8 \times 10^{-3}$ | 242 | 252 |
| Example 40 | FIG. 4B | Absent | — | 1.10 | −0.28 | 79.9 | $3.8 \times 10^{-3}$ | 252 | 270 |
| Example 41 | FIG. 4A | Present | — | 1.39 | −0.19 | 78.6 | $2.9 \times 10^{-3}$ | 161 | 166 |
| Example 42 | FIG. 4B | Present | — | 1.43 | −0.21 | 79.9 | $2.9 \times 10^{-3}$ | 162 | 177 |
| Example 43 | FIG. 5A | Absent | Absent | 1.21 | −0.22 | 79.7 | $2.9 \times 10^{-3}$ | 253 | 261 |
| Example 44 | FIG. 5B | Absent | Absent | 1.55 | −0.14 | 79.8 | $4.7 \times 10^{-3}$ | 252 | 262 |
| Example 45 | FIG. 5A | Present | Absent | 1.12 | −0.28 | 79.9 | $3.1 \times 10^{-3}$ | 161 | 169 |
| Example 46 | FIG. 5B | Present | Absent | 1.11 | −0.28 | 79.9 | $3.8 \times 10^{-3}$ | 151 | 159 |
| Example 47 | FIG. 5A | Absent | Present | 1.32 | −0.23 | 78.7 | $2.9 \times 10^{-3}$ | 134 | 139 |
| Example 48 | FIG. 5B | Absent | Present | 1.40 | −0.23 | 78.7 | $3.5 \times 10^{-3}$ | 132 | 140 |
| Example 49 | FIG. 6A | Absent | Absent | 1.52 | −0.18 | 78.9 | $4.4 \times 10^{-3}$ | 252 | 265 |
| Example 50 | FIG. 6B | Absent | Absent | 1.33 | −0.23 | 78.7 | $2.9 \times 10^{-3}$ | 253 | 273 |

TABLE 3-continued

|  | Configuration of laminate | UV absorber in adhesive layer | | b* value of transparent gas barrier film | b* value of entire laminate | Total light transmittance [%] | Moisture permeability [g/m² · day] | Sheet resistance [Ω/□] | |
| --- | --- | --- | --- | --- | --- | --- | --- | --- | --- |
|  |  | Adhesive layer A1 | Adhesive layer A2 |  |  |  |  | Earlier stage | After UV exposure |
| Example 51 | FIG. 6A | Present | Absent | 1.41 | −0.18 | 78.9 | $3.6 \times 10^{-3}$ | 122 | 126 |
| Example 52 | FIG. 6B | Present | Absent | 1.50 | −0.19 | 78.9 | $4.7 \times 10^{-3}$ | 123 | 128 |
| Example 53 | FIG. 6A | Absent | Present | 1.70 | −0.13 | 78.5 | $3.7 \times 10^{-3}$ | 124 | 130 |
| Example 54 | FIG. 6B | Absent | Present | 1.69 | −0.09 | 80.0 | $3.1 \times 10^{-3}$ | 126 | 130 |
| Comparative Example 5 | See FIG. 4A | Absent | — | — | 1.01 | 85.0 | $2.8 \times 10^{-3}$ | — | — |
| Comparative Example 6 | See FIG. 6A | Absent | Present | — | 7.45 | 86.5 | $100 \times 10^{-3}$ | — | — |

INDUSTRIAL APPLICABILITY

According to the present disclosure, there are provided a transparent conductive gas barrier laminate in which a yellowish hue has been sufficiently reduced, and a device including the laminate.

REFERENCE SIGNS LIST

1 . . . Transparent gas barrier film; 1a . . . Transparent base film; 1b . . . Barrier layer; 1v . . . Vapor-deposited layer; 1c . . . Gas barrier covering layer; 5 . . . Transparent conductive layer; 7 . . . Transparent resin film; 9 . . . Coating layer; 10A, 10B, 20A, 20B, 30A, 30B, 40A, 40B . . . Transparent conductive gas barrier laminate; 50 . . . Driven unit; 100 . . . Device; A1, A2 . . . Adhesive layer.

What is claimed is:

1. A transparent conductive gas barrier laminate, comprising:
   a transparent gas barrier film and a transparent conductive layer, which is in direct physical contact with the transparent gas barrier film, wherein
   the transparent gas barrier film has a b* value of more than 0 in a L*a*b* color system;
   the transparent conductive layer contains a conductive polymer and has a b* value of less than 0 in the L*a*b* color system,
   the transparent gas barrier film includes at least two pairs of films, each pair being a transparent base film and a barrier layer that is formed on at least one surface of the transparent base film, and further includes an adhesive layer interposed between the two pairs of films,
   the barrier layer in each pair comprises a silicon oxide-deposited layer and the transparent base film in each pair is a polyethylene terephthalate film or a polyethylene naphthalate film, and
   the adhesive layer is formed by curing an adhesive consisting of an epoxy resin, an amine-based curing agent and optionally, a UV absorber.

2. The transparent conductive gas barrier laminate of claim 1, wherein the transparent gas barrier film has ultraviolet shielding properties.

3. The transparent conductive gas barrier laminate of claim 1, wherein the UV absorber is present in the adhesive.

4. The transparent conductive gas barrier laminate of claim 3, wherein the UV absorber is at least one of a benzotriazole-based compound, a benzophenone-based compound, or a triazine-based compound.

5. The transparent conductive gas barrier laminate of claim 1, the laminate further comprising a coating layer, which is a layer of the laminate furthest from the transparent conductive layer.

6. The transparent conductive gas barrier laminate of claim 5, wherein the coating layer has a pencil hardness of 2H or more.

7. The transparent conductive gas barrier laminate of claim 1, wherein the transparent conductive layer has a sheet resistance in a range of 100 Ω/sq to 1000 Ω/sq.

8. The transparent conductive gas barrier laminate of claim 1, wherein the laminate has a b* value of less than 0 in the L*a*b* color system.

9. The transparent conductive gas barrier laminate of claim 1, wherein a thickness of the transparent base film is from 12 microns to 30 microns.

10. The transparent conductive gas barrier laminate of claim 1, wherein the barrier layer further comprises a gas barrier covering layer, the gas barrier covering layer comprising a water soluble polymer and a metal alkoxide.

11. The transparent conductive gas barrier laminate of claim 1, wherein the adhesive layer has an oxygen permeability from 0.1 cm³/(m²·day·atm) to 10 cm³/(m²·day·atm).

12. A device, comprising:
   the transparent conductive gas barrier laminate of claim 1, and
   a driven unit that is disposed so as to face the transparent conductive layer of the transparent conductive gas barrier laminate.

13. The device of claim 12, wherein the laminate further comprises a transparent resin film having ultraviolet shielding properties, wherein the transparent resin film faces a second side of the transparent conductive layer, which is opposite to a first side of the transparent conductive layer facing the driven unit.

* * * * *